(12) United States Patent
Li et al.

(10) Patent No.: US 6,358,852 B1
(45) Date of Patent: Mar. 19, 2002

(54) DECAPSULATION TECHNIQUES FOR MULTI-CHIP (MCP) DEVICES

(75) Inventors: Susan Xia Li, Fremont; Mohammad Massoodi, Campbell; Daniel Yim, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/574,580

(22) Filed: May 17, 2000

(51) Int. Cl.[7] .............................................. H01L 21/00
(52) U.S. Cl. ......................... 438/690; 216/67; 216/88; 438/691; 438/692; 438/710
(58) Field of Search ........................... 438/8, 690, 691, 438/692, 710, 725, 745, 753; 216/58, 67, 88, 91, 99, 59, 60, 84, 85; 156/345 L, 345 LP

(56) References Cited

U.S. PATENT DOCUMENTS 5,252,179 A * 10/1993 Ellerson et al. ........... 216/83 X
6,033,994 A * 3/2000 TikhonoV .................. 216/90 X
6,093,331 A * 7/2000 Wollesen ................... 216/95 X

* cited by examiner

*Primary Examiner*—William A. Powell
(74) *Attorney, Agent, or Firm*—Sawyer Law Group LLP

(57) ABSTRACT

Aspects for performing decapsulation of multi-chip devices are presented. One aspect includes removing a top die of the multi-chip device without employing a wet chemical etch and removing residual attach and package materials to expose a bottom die of the multi-chip device. An alternate aspect includes utilizing mechanical polishing and wet chemical etching to remove a top die of the multi-chip device, and exposing a bottom die through chemical decapsulation to allow failure analysis of the bottom die. A Flash memory die as a top die and a static random access memory (SRAM) die as a bottom die are included as a multi-chip device capable of decapsulation through these aspects.

22 Claims, 3 Drawing Sheets

DECAPSULATION TECHNIQUES FOR MULTI-CHIP (MCP) DEVICES

FIELD OF THE INVENTION

The present invention relates to multi-chip devices, and more particularly to decapsulation techniques for multi-chip devices.

BACKGROUND OF THE INVENTION

Innovations in integrated circuit devices have led to the formation of a multi-chip package. An example of a multi-chip package is a stacked die configuration consisting of a (DIE 1) top die 10, e.g., a Flash memory die, attached via an adhesive 12 to a (DIE 2) bottom die 14, e.g., an SRAM die, mounted on a substrate 16, e.g., BT (Bismaleimide Triazine) resin, in an FBGA (Fine Ball Grid Array) package 18, as shown in the cross-section illustration of FIG. 1. Each die is wire bonded to an interposer 20, e.g., copper foil, via wire bonds 22 and 24. A design restriction in this structure requires the top die 10 to be smaller than the bottom die 14, which allows space for wire bonding for the bottom die. Advantageously, with the multi-chip package, the dies share common address and data buses, allowing for a package with a low pin count.

For performing failure analysis on the top die (DIE 1) 10 of this type of package, the techniques utilized on conventional packages can still be used, with package decapsulation performed using a commercial chemical automatic jet-etch decapper (autodecapper). However, if failure analysis is required on the bottom die (DIE 2) 14, it is a challenge to remove the top die 10 while keeping the bottom die 14 fully functional for further analysis.

Accordingly, what is needed is a system and method for a new technique to achieve removal of a top die without damaging the bottom die in a multi-chip package in order to retain full failure analysis capability on these types of packaged devices. The present invention addresses such a need.

SUMMARY OF THE INVENTION

Aspects for performing decapsulation of multi-chip devices are presented. One aspect includes removing a top die of the multi-chip device without employing a wet chemical etch and removing residual attach and package materials to expose a bottom die of the multi-chip device. An alternate aspect includes utilizing mechanical polishing and wet chemical etching to remove a top die of the multi-chip device, and exposing a bottom die through chemical decapsulation to allow failure analysis of the bottom die. A Flash memory die as a top die and a static random access memory (SRAM) die as a bottom die are included as a multi-chip device capable of decapsulation through these aspects.

With the present invention, alternate techniques of decapsulation for stacked die integrated circuit devices are provided. In the preferred aspects, mechanical polishing is employed at least once during the removal of a top die to reduce the possibility of overetching a bottom die. Thus, the present invention maintains the integrity of the bottom die to allow failure analysis of the bottom die in a straightforward and effective manner. These and other advantages of the present invention will be more filly understood in conjunction with the following detailed description and accompanying drawings.

DETAILED DESCRIPTION

The present invention relates to decapsulation techniques for a multi-chip package. The following description is presented to enable one of ordinary skill in the art to make and use the invention and is provided in the context of a patent application and its requirements. Various modifications to the preferred embodiment and the generic principles and features described herein will be readily apparent to those skilled in the art. For example, the description refers to a Flash die over an SRAM die configuration for the multi-chip package. The technique, in general, is applicable to any combination of stacked die, generically referred to as DIE 1 over DIE 2, where DIE 2 is generally the larger of the two die. Thus, the present invention is not intended to be limited to the embodiment shown but is to be accorded the widest scope consistent with the principles and features described herein.

Figure 1:
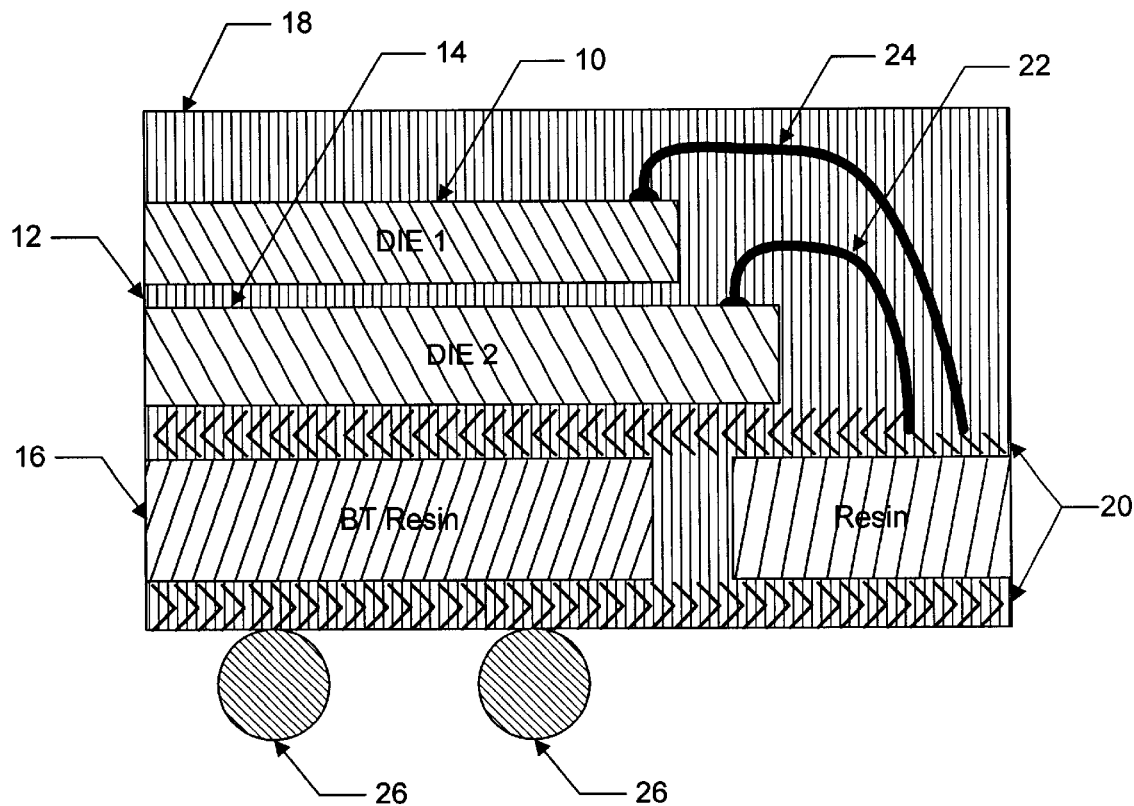
FIG. 1 illustrates a cross-section diagram of a prior art, stacked die, multi-chip package.
Figure 2:
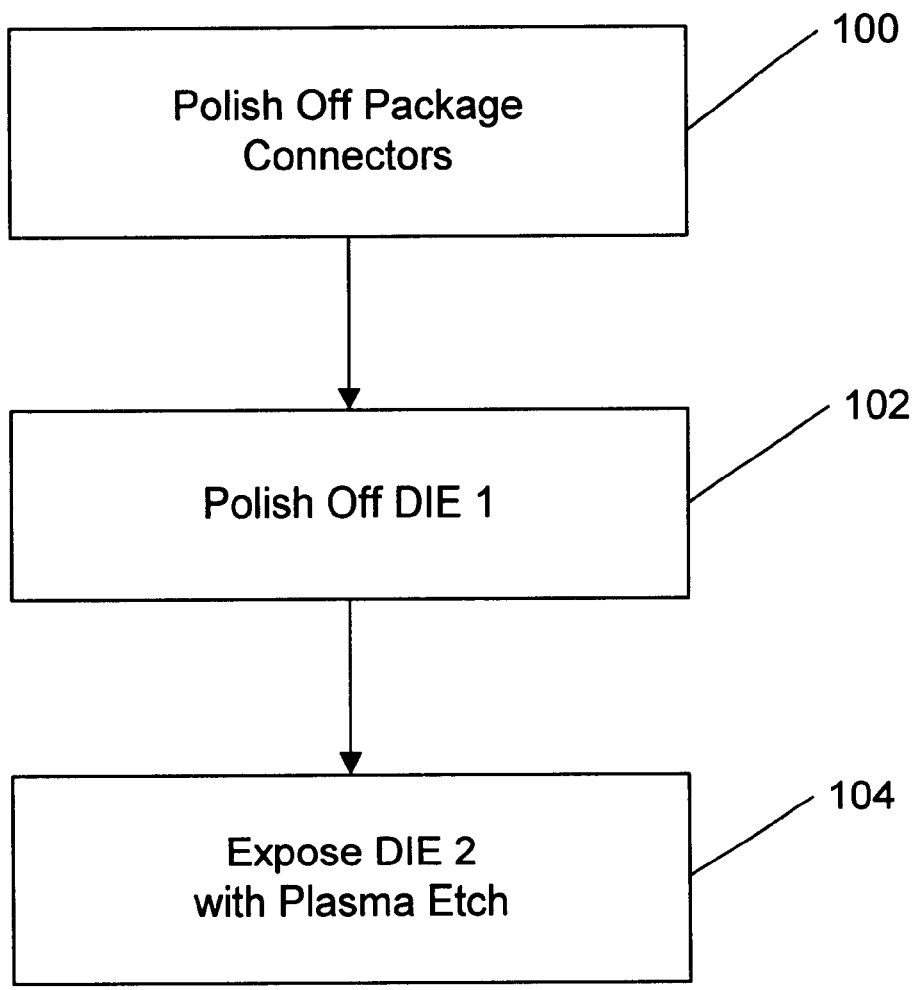
FIG. 2 illustrates a block diagram of a method for decapsulation of a multi-chip package in accordance with one embodiment of the present invention.

One preferred method of decapsulation is presented with reference to the block flow diagram of FIG. 2. The method initiates with a first polishing step to polish off circuit connection material, e.g. solder balls (26, FIG. 1), on the backside of the package 18 (step 100). The polishing off of the solder balls 26 improves the uniformity of polishing for the top die 10 removal. For example, a 30 um (micron) polish sheet used for 20 minutes in a high precision polisher to completely remove the solder balls 26 on the backside of the package (using solder mask removal as stop point monitor) is suitable for the first polishing step.

The method continues with a second polishing step to remove the top die 10 (step 102) after remounting the device in a sample holder. The second polishing step suitably uses a 30 um polish sheet for 20 minutes to remove most of the top die 10 until the adhesive 12 between DIE 1 and DIE 2 shows at a corner. Then, a 3 um polish sheet is used for 30 minutes to remove the remaining top die silicon and expose the entire adhesive/polyimide layer 12 on top of the bottom die 14.

Once the top die 10 is removed, the process continues with removal of the remaining adhesive/polyimide layer 12 and plastic compound in the bond pad areas of the bottom die 14 through plasma dry etching (step 104). Suitable conditions for the plasma dry etch step include use of an oxygen/argon plasma chemical with a plasma power of 150W (watts), a plasma flow of 20 milliTorr, and a plasma etching time of about 20–40 minutes until all bond pads are exposed, as is well appreciated by those skilled in the art.

An advantage of using the method shown in FIG. 2 is that no wet chemical etching is involved through the entire top die removal process. Thus, the bottom die is unlikely to be damaged due to wet chemical exposure. Uniformity of polishing is important for the success, since the polishing process needs to stop at the adhesive level between the two dies, which is only around 1–2 um thick. While providing better avoidance of damage to the bottom die, it is unfortunate that the original package cannot be used for electrical testing, since all wire bonds are polished off during the process. In order to electrically test the device, the polished needs to be assembled in a new package, such as a Ceramic Dual-In-Line Package (CDIP), for further analysis.

Figure 3:
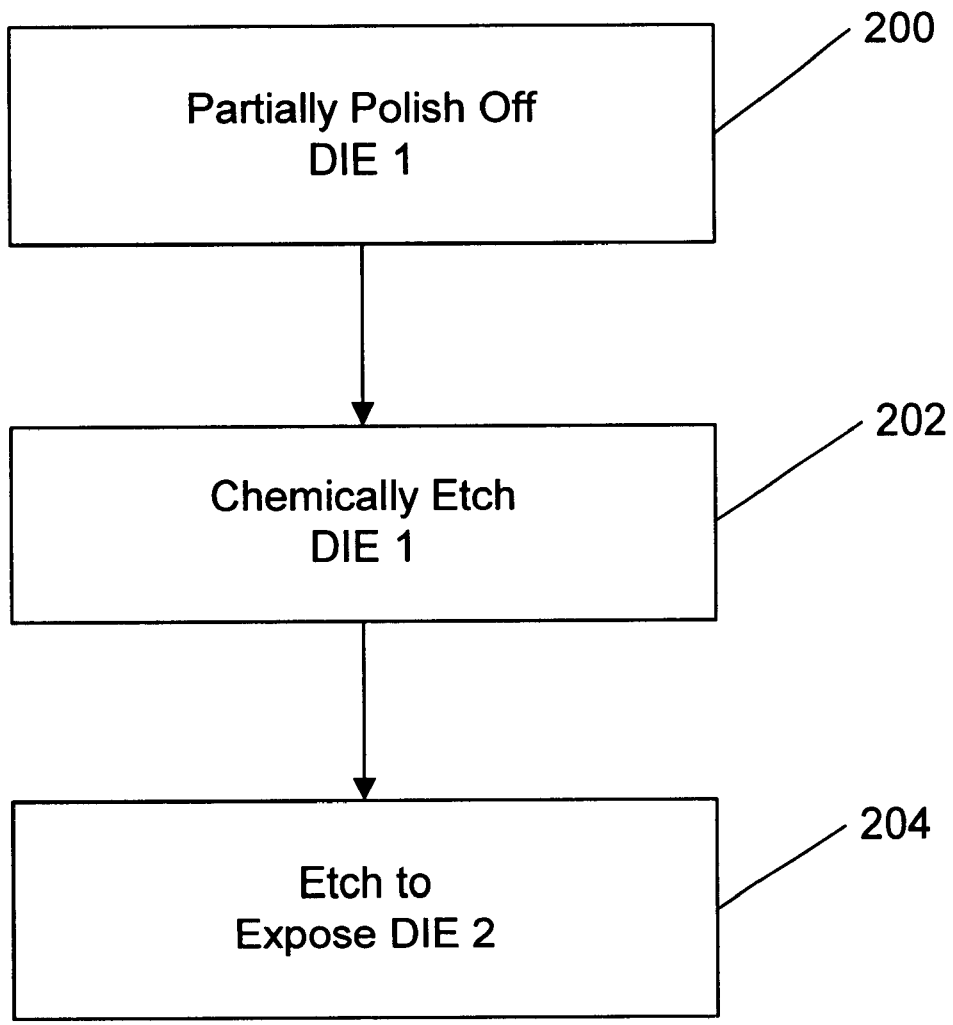
FIG. 3 illustrates a block diagram of a method for decapsulation of a multi-chip package in accordance with another embodiment of the present invention.

An alternate method retains the ability to use the original package for electrical testing while providing for decapsulation to expose the bottom die. FIG. 3 illustrates a block flow diagram of an alternate method for decapsulation. As shown, the process initiates with a polishing step (step 200). The polishing step partially polishes off the top die 10 using a high precision polisher. For example, a 30 un polish sheet used for 15 minutes to partially remove the top die 10 is suitable. Preferably, the polishing is stopped before reaching the highest point of the wire bond loops 24 of the bottom die, which can be checked using an optical microscope during the polishing step, as is well understood by those skilled in the art.

A chemical etching step (step 202) to etch off the remaining part of the top die 10 follows by immersing the entire package in an appropriate chemical solution. Suitable chemical etch conditions include the use of KOH (potassium hydroxide 45%) as the etchant at an etch temperature of 110–120° C. (centigrade) for about 20 minutes or until the top die 10 is completely etched off.

Once the top die is removed, the entire bottom die is exposed by etching off the adhesive 12 via chemical decapsulation using an autodecapper (step 204). A suitable chemical decapsulation uses fuming sulfuric acid with an etch temperature of 200° C., a heat-up time of about 120 seconds, an etch time of about 80 seconds, and a rinse time of about 22 seconds.

With the alternate embodiment of FIG. 3, the exposing of the entire top die first with mechanical polishing allows chemical etching to occur without potential damage (over-etch) during the decapsulation process. The whole process is straightforward with minimal difficulty. Further, the original package is still able to be used for electrical testing.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for decapsulation of a multi-chip device, the method comprising:
   removing a top die of the multi-chip device by performing mechanical polishing; and
   removing residual attach and package materials to expose a bottom die of the multi-chip device.

2. The method of claim 1 wherein performing mechanical polishing further comprises polishing off circuit connection material at a backside of the multi-chip device.

3. The method of claim 2 wherein circuit connection material further comprises solder balls.

4. The method of claim 2 further comprising remounting the multi-chip device in a sample holder and polishing off the top die.

5. The method of claim 4 wherein removing residual attach and package materials further comprises dry etching remaining adhesive and package compound material in bond pad areas of the bottom die.

6. The method of claim 1 wherein the top die furthur comprises a Flash memory die.

7. The method of claim 6 wherein the bottom die further comprises an SRAM (static random access memory) die.

8. A method for decapsulation of a multi-chip device, the method comprising:
   (a) utilizing mechanical polishing and wet chemical etching to remove a top die of the multi-chip device; and
   (b) exposing a bottom die through chemical decapsulation to allow failure analysis of the bottom die.

9. The method of claim 8 wherein step (a) further comprises (a1) partially polishing off the top die.

10. The method of claim 9 wherein step (a) further comprises (a2) halting the partial polishing before reaching a highest point of wire bonds for the bottom die.

11. The method of claim 10 wherein step (a) further comprises (a3) performing a wet chemical etch to fully remove the top die.

12. The method of claim 8 wherein step (b) further comprises utilizing an autodecapper to expose the bottom die.

13. The method of claim 8 wherein step (a) removes a Flash memory die.

14. The method of claim 13 wherein step (b) removes an SRAM die.

15. A method for decapsulation of a multi-chip device, the method comprising:
   removing a Flash memory die of the multi-chip device with at least one mechanical polish; and
   etching to expose an SRAM (static random access memory) die under the Flash memory die without damaging the SRAM die to allow failure analysis of the SRAM die.

16. The method of claim 15 wherein removing a Flash memory die further comprises polishing off circuit connection material at a backside of the multi-chip device.

17. The method of claim 16 wherein circuit connection material further comprises solder balls.

18. The method of claim 16 further comprising remounting the multi-chip device in a sample holder and polishing off the Flash memory die.

19. The method of claim 18 wherein etching to expose the SRAM die further comprises dry etching remaining adhesive and package compound material in bond pad areas of the SRAM die.

20. The method of claim 15 wherein removing a Flash memory die further comprises partially polishing off the Flash memory die and halting the partial polishing before reaching a highest point of wire bonds for the SRAM die.

21. The method of claim 20 wherein removing a Flash memory die further comprises performing a chemical etch to filly remove the Flash memory die.

22. The method of claim 21 wherein etching to expose an SRAM die further comprises utilizing an autodecapper to expose the SRAM die.

* * * * *